(12) United States Patent
Andou (10) Patent No.: US 10,135,013 B2
(45) Date of Patent: Nov. 20, 2018

(54) METHOD FOR MANUFACTURING DISPLAY DEVICE AND DISPLAY DEVICE HAVING A FLEXIBLE SUBSTRATE

(71) Applicant: Japan Display Inc., Minato-ku (JP)

(72) Inventor: Naohisa Andou, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/587,625

(22) Filed: May 5, 2017

(65) Prior Publication Data

US 2018/0019417 A1 Jan. 18, 2018

(30) Foreign Application Priority Data

Jul. 15, 2016 (JP) .................................. 2016-140112

(51) Int. Cl.
| | | |
|---|---|---|
| *H01L 51/00* | (2006.01) | |
| *H05K 1/02* | (2006.01) | |
| *H01L 51/56* | (2006.01) | |
| *H05K 1/11* | (2006.01) | |
| *H01L 27/32* | (2006.01) | |

(52) U.S. Cl.
CPC .......... *H01L 51/0097* (2013.01); *H01L 51/56* (2013.01); *H05K 1/028* (2013.01); *H05K 1/0269* (2013.01); *H01L 27/3244* (2013.01); *H01L 2251/5338* (2013.01); *H05K 1/118* (2013.01); *H05K 999/99* (2013.01); *H05K 2201/05* (2013.01)

(58) Field of Classification Search
None
See application file for complete search history.

(56) References Cited

U.S. PATENT DOCUMENTS

| | | | | |
|---|---|---|---|---|
| 9,287,329 B1 * | 3/2016 | Lee | ..................... | H01L 51/0097 |
| 9,769,919 B2 * | 9/2017 | Park | ..................... | H05K 1/147 |
| 2006/0152662 A1 * | 7/2006 | Ko | ..................... | G02F 1/13452 |
| | | | | 349/149 |
| 2014/0091704 A1 * | 4/2014 | Furuie | ..................... | H01L 51/5284 |
| | | | | 313/504 |
| 2014/0217382 A1 * | 8/2014 | Kwon | ..................... | H01L 51/0097 |
| | | | | 257/40 |
| 2016/0093685 A1 * | 3/2016 | Kwon | ..................... | H01L 27/3276 |
| | | | | 257/40 |
| 2018/0027673 A1 * | 1/2018 | Andou | ..................... | H05K 5/0017 |

FOREIGN PATENT DOCUMENTS

JP 2007-27222 2/2007

* cited by examiner

*Primary Examiner* — Andres Munoz
(74) *Attorney, Agent, or Firm* — Oblon, McClelland, Maier & Neustadt, L.L.P.

(57) ABSTRACT

A method for manufacturing a display device includes the steps of preparing a spacer that includes a first alignment mark, forming a notch on a back reinforcing film and cutting the back reinforcing film in a size corresponding to a size of a first bottom surface, disposing the back reinforcing film on a back surface side of a display area, disposing the spacer on a back surface side of a flexible substrate, and bending a bent area so as to conform to a shape of the spacer and disposing a terminal area on a back surface side of the spacer. In the step of disposing the spacer, viewed from the back surface side of the flexible substrate, the spacer is positioned on the back reinforcing film based on a position of the notch and a position of the first alignment mark.

6 Claims, 14 Drawing Sheets

METHOD FOR MANUFACTURING DISPLAY DEVICE AND DISPLAY DEVICE HAVING A FLEXIBLE SUBSTRATE

CROSS-REFERENCE TO RELATED APPLICATION

The present application claims priority from Japanese application JP2016-140112 filed on Jul. 15, 2016, the content of which is hereby incorporated by reference into this application.

BACKGROUND OF THE INVENTION

1. Field of the Invention

The present invention relates to a display device and a method for manufacturing the display device.

2. Description of the Related Art

There has been an increasing need for narrowing a so-called frame area, which is on the periphery of a display area, so as to downsize a display device or expand the display area. In particular, demand for a narrower frame has been increasing in mobile devices, such as smartphones.

As such, narrowing a frame by using a flexible substrate and folding an area outside the display area toward the back side of the display area has been considered. The area outside the display area includes wirings and circuits. When the flexible substrate is bent, wiring disconnection or damage may occur due to bending stress on the bent part. In this regard, JP2007-27222A discloses that a restriction film prevents wiring disconnection, for example.

Here, spacers disposed inside of a bend of a flexible substrate can be considered to guide the bend. Further, a film to reinforce the flexible substrate can be considered to be disposed inside the bend of the flexible substrate. Such a configuration requires the reinforcing film not to interfere with the spacers.

SUMMARY OF THE INVENTION

One or more embodiments of the present invention have been conceived in view of the above, and an object thereof is to provide a display device and a method for manufacturing the display device that prevent a reinforcing film provided inside a flexible substrate from interfering with a spacer.

A method for manufacturing a display device according to one aspect of the present invention includes the steps of preparing a flexible substrate having flexibility on which a display area, a frame area, a bent area, and a terminal area are provided in this order, the display area displaying an image, the terminal area including a terminal, preparing a spacer that includes a first bottom surface on a display surface side and a first alignment mark on a back surface side, the first bottom surface being more recessed than other areas because of a first step being formed on the first bottom surface, preparing a first reinforcing film, forming a second alignment mark on the first reinforcing film and cutting the first reinforcing film so as to correspond to a size of the first bottom surface, disposing the first reinforcing film on a back surface side of the display area, disposing the spacer on a back surface side of the flexible substrate by disposing the first bottom surface on the first reinforcing film, and bending the bent area so as to conform to a shape of the spacer and disposing the terminal area on the back surface side of the spacer, wherein in the step of disposing the spacer, viewed from the back surface side of the flexible substrate, the spacer is positioned on the first reinforcing film based on a position of the first alignment mark and a position of the second alignment mark.

A display device according to another aspect of the present invention includes a spacer that includes a first bottom surface on a display surface side and a first alignment mark on a back surface side, the first bottom surface being more recessed than other areas because of a first step being formed on the first bottom surface, a flexible substrate having flexibility that includes a display area displaying an image, a frame area on a perimeter of the display area, a bent area that is outside the frame area and bent so as to conform to a shape of the spacer, and a terminal area that is disposed on a back surface side of the spacer through the bent area and includes a terminal, and a first reinforcing film that is disposed on the first bottom surface, which is the back surface side of the display area, and includes a second alignment mark at a position adjacent to the first alignment mark.

DETAILED DESCRIPTION OF THE INVENTION

An embodiment of the present invention (hereinafter referred to as "present embodiment") will be described below in detail with reference to the accompanying drawings. The disclosure herein is merely an example, and appropriate modifications coming within the spirit of the present invention, which are easily conceived by those skilled in the art, are intended to be included within the scope of the invention as a matter of course. In the accompanying drawings, widths, thicknesses, shapes, or other characteristics of each part are schematically illustrated compared to actual configurations for clarity of illustration. However, such a schematic illustration is merely an example and not intended to limit the present invention. In the present specification and drawings, some elements identical or similar to those shown previously are denoted by the same reference signs as the previously shown elements, and thus repetitive detailed descriptions of them may be omitted as appropriate.

In the present embodiment, when a manner in which a structure is disposed "on" another structure is described, it is understood, if not otherwise stated, that simply describing "on" includes both a case in which the structure is disposed directly on the another structure in contact with each other and a case in which the structure is disposed above or over the another structure with a third structure interposed therebetween.

Figure 1:
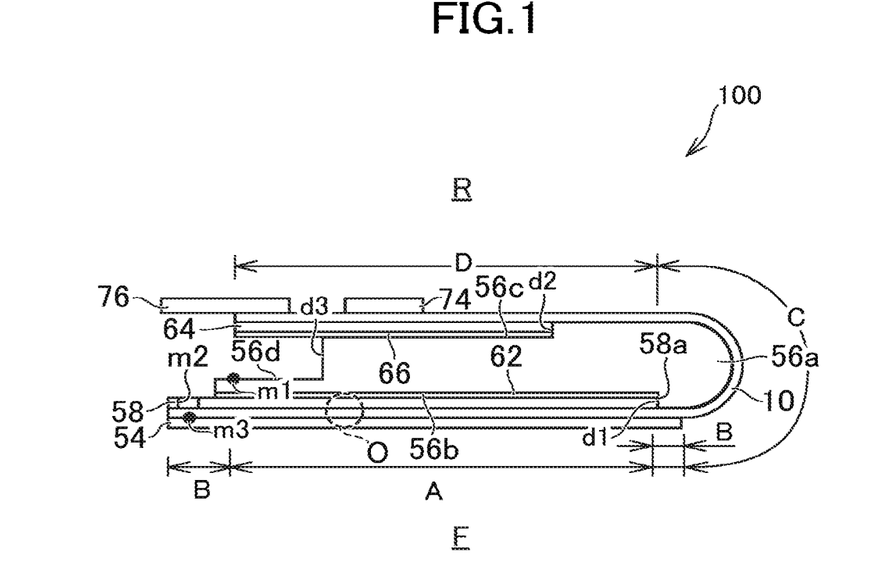
FIG. 1 is a side view of a display device illustrating an overall schematic diagram of the display device according to the present embodiment.

FIG. 1 is a side view of a display device illustrating an overall schematic diagram of the display device according to the present embodiment. In the following, a side of the flexible substrate 10 in a display area A on which an image is displayed (the bottom of FIG. 1 etc.) is defined as a display surface side F, and a side opposite to the display surface side F (top of FIG. 1 etc.) is defined as a back surface side R.

In the present embodiment, an organic electroluminescence display device is used as an example of the display device 100, although any display device using a flexible substrate 10, such as a liquid crystal display device, may be used. The display device 100 combines unit pixels SP (sub-pixel) in a plurality of colors including red, green, and blue to form full-colored pixels P, and displays a full-colored image (see FIG. 11).

Figure 2:
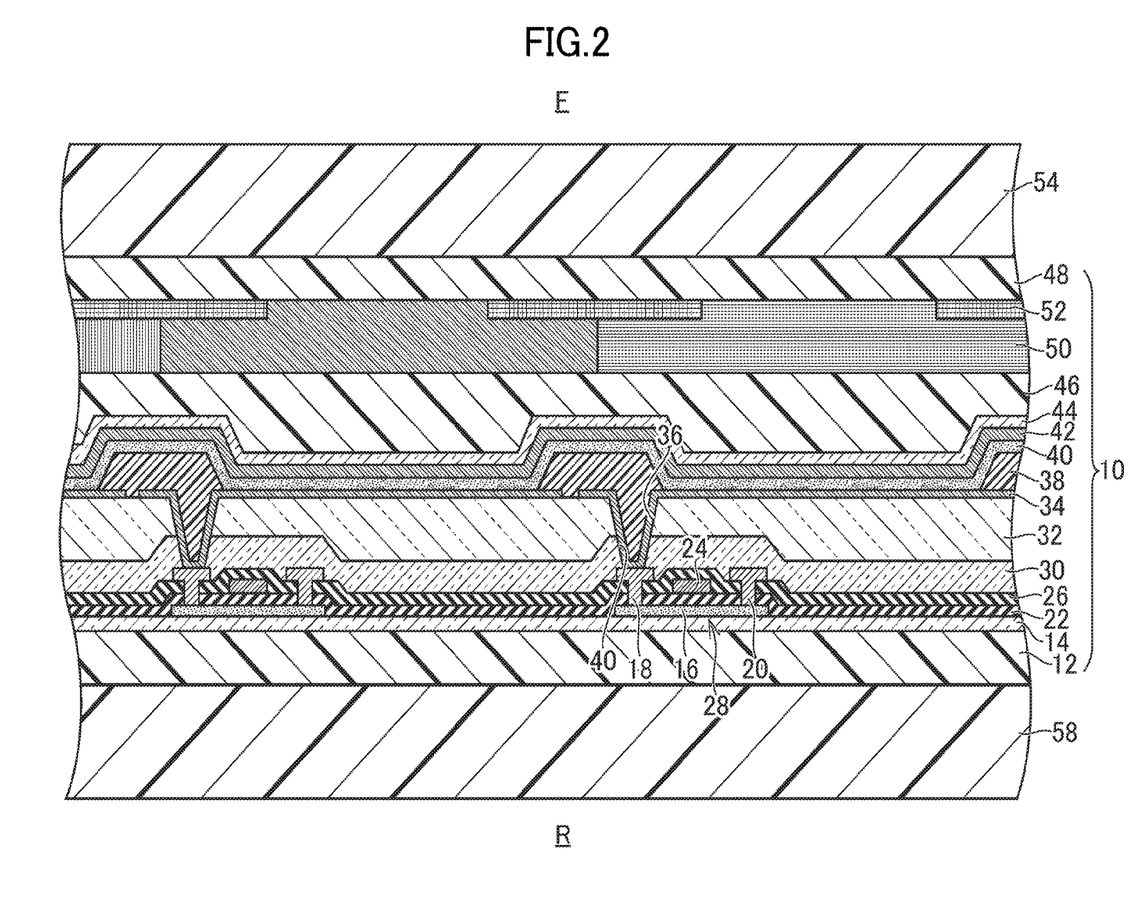
FIG. 2 is an enlarged cross-sectional view of a part encompassed by a dashed circle O in FIG. 1.
Figure 11:
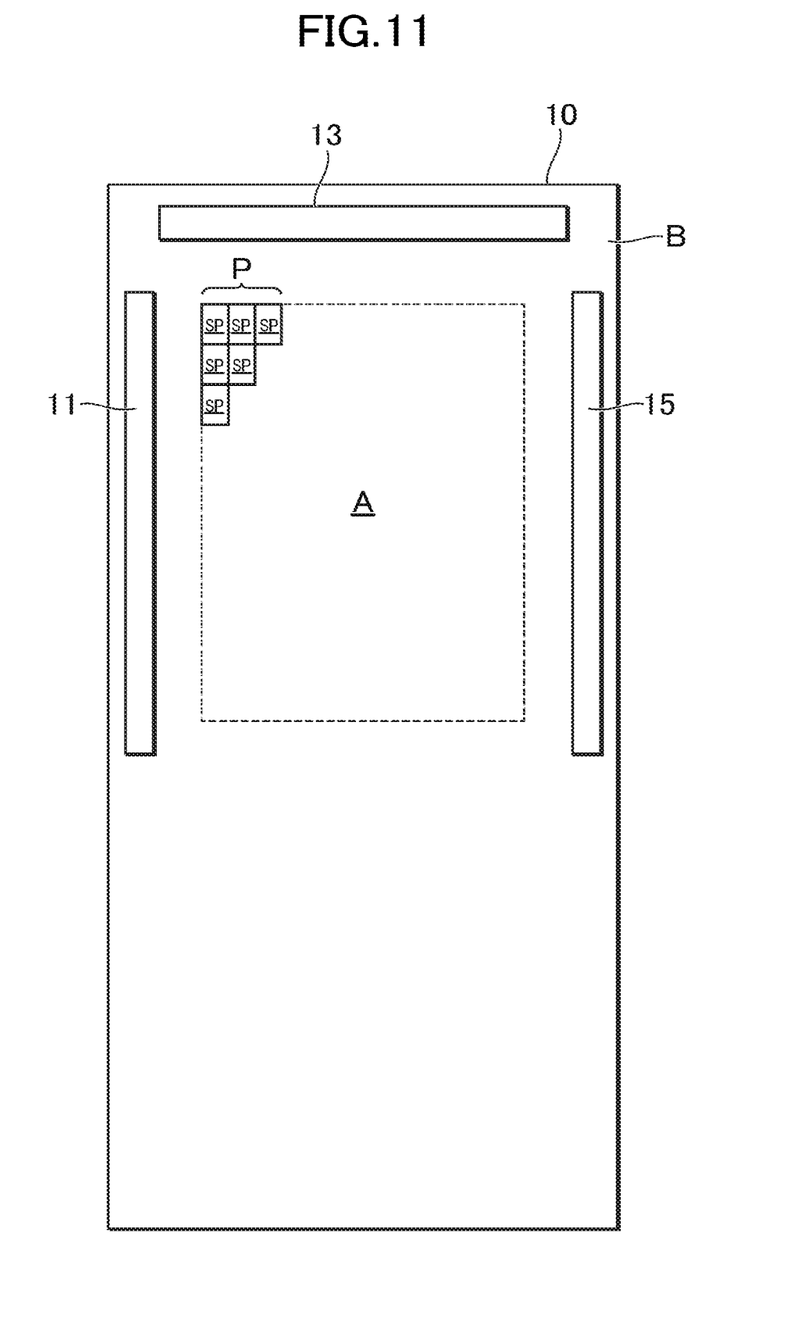
FIG. 11 is a plan view of the flexible substrate in a developed state indicating pixel arrangement and peripheral circuits.

As shown in FIG. 1, the display device 100 includes a transparent flexible substrate 10. Referring to FIG. 2, a configuration of the flexible substrate 10 will be described below in details. FIG. 2 is an enlarged cross-sectional view of a part encompassed by a dashed circle O in FIG. 1. In FIG. 2, unlike the other drawings, the top of the figure is the display surface side F, and the bottom is the back surface side R. FIG. 11 is a plan view of the flexible substrate in a developed state indicating pixel arrangement and peripheral circuits. As shown in FIG. 11, pixels P are disposed in a matrix in the display area A of the flexible substrate 10, and peripheral circuits 11, 13, and 15 are disposed in a frame area B described later. FIG. 11 illustrates only some of pixels P, although pixels P are disposed substantially all of the display area A. Although not shown, wirings such as gate lines and signal lines extend from the peripheral circuits 11, 13, and 15 toward the display area A. The signal lines extend from an integrated circuit chip 74, which will be described later, to the pixels P.

As shown in FIG. 2, the flexible substrate 10 includes a first substrate 12 formed of a resin. An undercoat 14 is formed on the first substrate 12 in order to serve as a barrier to impurities contained in the first substrate 12, and a semiconductor layer 16 is formed on the undercoat 14. A source electrode 18 and a drain electrode 20 are electrically connected to the semiconductor layer 16, and a gate insulating film 22 is formed so as to cover the semiconductor layer 16. A gate electrode 24 is formed on the gate insulating film 22, and an insulating interlayer 26 is formed so as to cover the gate electrode 24. The source electrode 18 and the drain electrode 20 penetrate the gate insulating film 22 and the insulating interlayer 26. The semiconductor layer 16, the source electrode 18, the drain electrode 20, and the gate electrode 24 forma thin-film transistor 28. The passivation film 30 is disposed so as to cover the thin-film transistor 28.

A flattening layer 32 is disposed on the passivation film 30. A plurality of pixel electrodes 34 (e.g., anodes) are disposed on the flattening layer 32 so as to correspond to respective unit pixels SP. The flattening layer 32 is formed such that at least a surface on which the pixel electrode 34 is disposed is flat. The pixel electrode 34 is electrically connected to one of the source electrode 18 and the drain electrode 20 on the semiconductor layer 16 through a contact hole 36 penetrating the flattening layer 32 and the passivation film 30.

An insulating layer 38 is formed on the flattening layer 32 and the pixel electrode 34. The insulating layer 38 is formed on the perimeter of the pixel electrode 34 so as to make an opening on a part (e.g., the center) of the pixel electrode 34. The insulating layer 38 forms a bank that surrounds a part of the pixel electrode 34.

A light emitting element layer 40 is disposed on the pixel electrode 34. The light emitting element layer 40 is continuously disposed over a plurality of pixel electrodes 34, and also disposed over the insulating layer 38. As a variation, a light emitting element layer 40 may be provided to each (separated) pixel electrode 34. In this case, the light emitting element layers 40 emit light in blue, red, and green colors corresponding to respective pixels. This eliminates a need for providing a color filter described later. The light emitting element layer 40 includes at least a light emitting layer, and may further include at least one of an electron transport layer, a hole transport layer, an electron injection layer, and a hole injection layer.

A common electrode 42 (e.g., cathode) is provided on the light emitting element layer 40 such that the common electrode 42 is in contact with the light emitting element layer 40 on the plurality of pixel electrodes 34. The common electrode 42 is formed so as to be disposed on the insulating layer 38, which is a bank. The light emitting element layer 40 is disposed between the pixel electrode 34 and the common electrode 42, controlled in brightness by an electric current that flows between them, and emits light.

The light emitting element layer 40 is covered by a sealing layer 44 stacked on the common electrode 42, and is thus sealed and protected from moisture. A second substrate 48 is provided on the sealing layer 44 through a filler layer 46. The second substrate 48 has colored layers 50 in a plurality of colors (e.g., blue, red, green), and a black matrix 52 is formed of metal or resin between two adjacent colored layers 50 in different colors, and serves as a color filter. The second substrate 48 may be a touch panel, or include a polarizing plate or a retardation plate.

Figure 3:
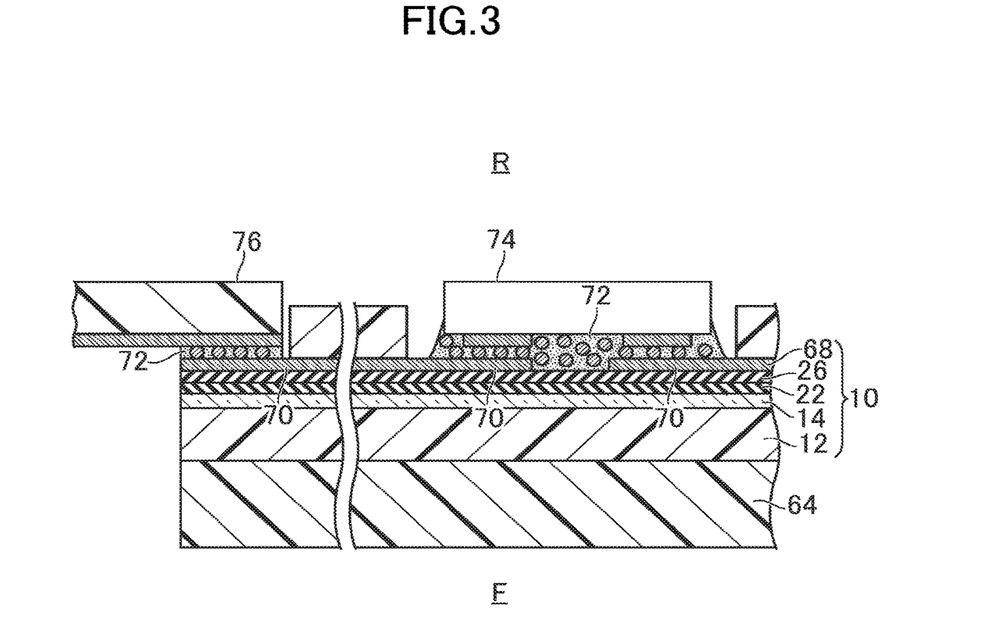
FIG. 3 is an enlarged cross-sectional view of the vicinity of an edge of a terminal area D of the flexible substrate.

FIG. 3 is an enlarged cross-sectional view of the vicinity of an edge of a terminal area D (see FIG. 1) of the flexible substrate 10. A wiring 68 is provided in the terminal area D. The wiring 68 extends from the display area A to the edge of the terminal area D through the frame area B and a bent area C. The wiring 68 is formed on the same layer as, for example, the source electrode 18 and the drain electrode 20. The wiring 68 includes terminals 70. The terminals 70 are electrically connected to the integrated circuit chip 74 and an FPC (Flexible Printed Circuits) substrate 76 through an anisotropic conductive film 72. The integrated circuit chip 74 may be disposed on and electrically connected to the FPC substrate 76.

Referring to FIG. 1, an overall configuration of the display device 100 will be described.

As shown in FIG. 1, the display device 100 includes the spacers 56, a surface reinforcing film 54, back reinforcing films 58 and 64, the integrated circuit chip 74, and the FPC substrate 76, in addition to the flexible substrate 10. The surface reinforcing film 54 and the back reinforcing films 58 and 64 are provided so as to reinforce and protect the flexible substrate 10. The spacers 56 are provided to guide the bend of the flexible substrate 10.

The flexible substrate 10 includes the display area A for displaying an image, the frame area B on the perimeter of the display area A, the bent area C outside the frame area B, and the terminal area D closer to the back surface side R than the spacers 56 through the bent area C. The display area A and the frame area B are placed closer to the display surface side F than the spacers 56. The bent area C is formed in a bent shape so as to conform to the shapes of the spacers 56. The frame area B surrounds four sides of the display area A in a plan view.

The display surface side F of the frame area B includes third alignment marks m3 that serve as a mark when the spacers 56 is positioned on the back reinforcing film 58. A pair of third alignment marks m3 are provided to oppose to each other in the width direction of the flexible substrate 10 (see FIG. 9B).

As shown in FIG. 1, the surface reinforcing film 54 is disposed on the display surface side F of the flexible substrate 10 in the display area A and the frame area B so as not to overlap the bent area C.

As shown in FIG. 1, the back reinforcing film 58 is disposed on the back surface side R of the flexible substrate 10 in the display area A. The back reinforcing film 64 is disposed on the display surface side F of the flexible substrate 10 in the terminal area D. In other words, the back reinforcing films 58 and 64 are disposed inside of the bend of the flexible substrate 10.

As shown in FIG. 1, the back reinforcing film 64 is affixed to the surface of the spacer 56 on the back surface side R by the adhesive member 66, and the back reinforcing film 58 is affixed to the surface of the spacer 56 on the display surface side F by the adhesive member 62. The adhesive member 62 and the adhesive member 66 may be made of adhesive resin, for example, or a double-sided tape.

The back reinforcing film 58 includes a notch m2 that penetrates from the back surface side R to the display surface side F. The notch m2 is provided on a position that overlaps the third alignment mark m3 on the flexible substrate 10. The notch m2 corresponds to the second alignment mark of the present invention.

As shown in FIG. 1, the spacer 56 is shaped such that a guide section 56a in contact with the bent area C of the flexible substrate 10 is curled in a side view. Such a shape prevents wiring disconnection or damage of the wiring 68 in the bent area C of the flexible substrate 10.

A first step d1 is formed on the display surface side F of the spacer 56. Since the first step d1 is formed, a first bottom surface 56b of the spacer 56 is more recessed than other areas by the thickness of the back reinforcing film 58 and the adhesive member 62. The back reinforcing film 58 is affixed to the first bottom surface 56b by the adhesive member 62.

A second step d2 is formed on the back surface side R of the spacer 56. Since the second step d2 is formed, a second bottom surface 56c of the spacer 56 is more recessed than other areas by the thickness of the back reinforcing film 64 and the adhesive member 66. The back reinforcing film 64 is affixed to the second bottom surface 56c by the adhesive member 66.

Further, a third step d3 is formed on the back surface side R of the spacer 56. Since the third step d3 is formed, a third bottom surface 56d of the spacer 56 is more recessed than the second bottom surface 56c. The third bottom surface 56d includes a first alignment mark m1 that serves as a mark when the spacers 56 on the back reinforcing film 58 is positioned. The first alignment mark m1 is disposed so as to be adjacent to the third alignment mark m3 and the notch m2, which serves as the second alignment mark, in the longitudinal direction (horizontal direction in FIG. 1) of the flexible substrate 10.

Figure 4:
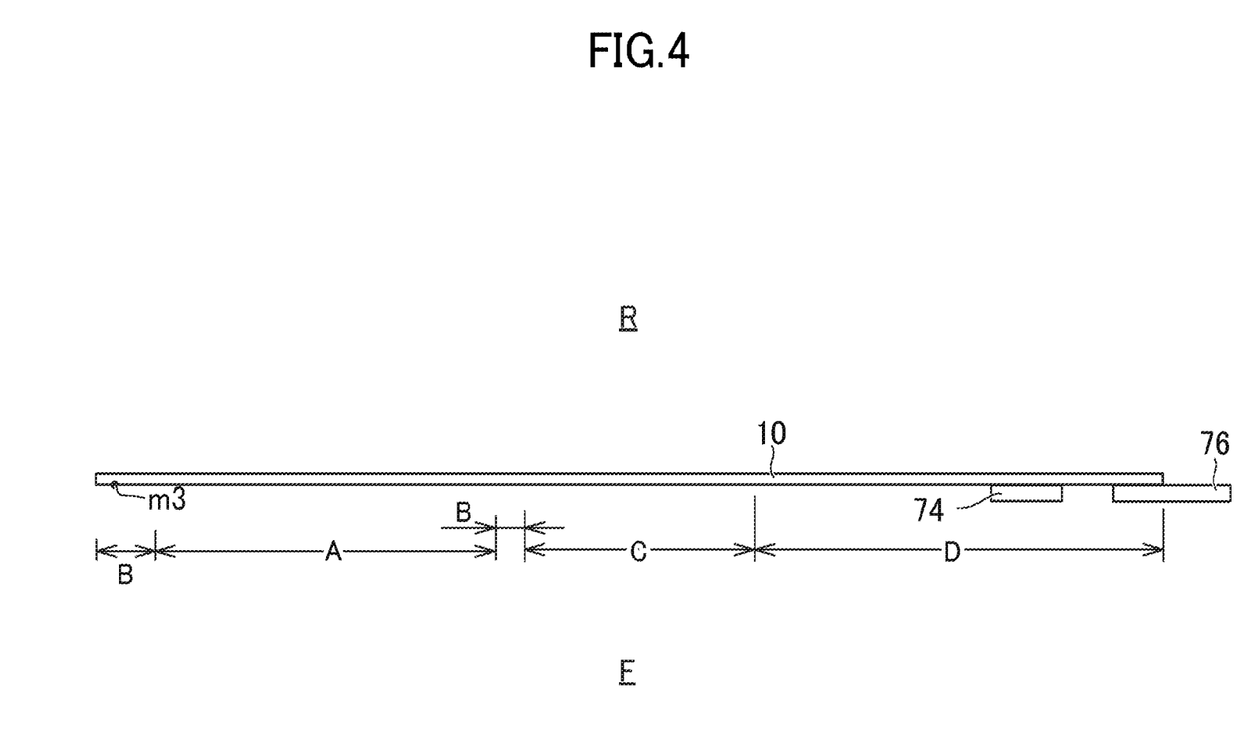
FIG. 4 is a side view of the flexible substrate in a developed state.
Figure 5A:
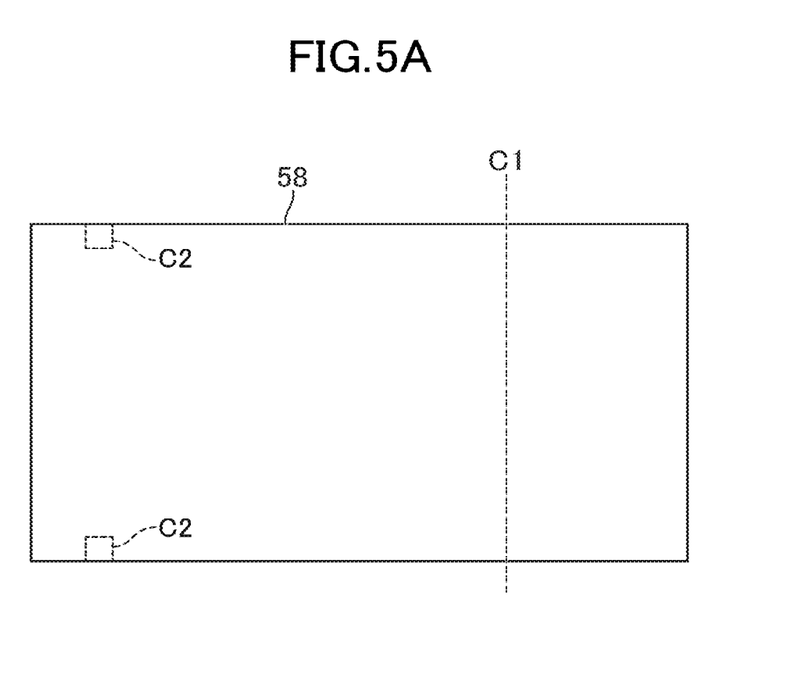
FIG. 5A is a plan view of an unprocessed back reinforcing film.
Figure 5B:
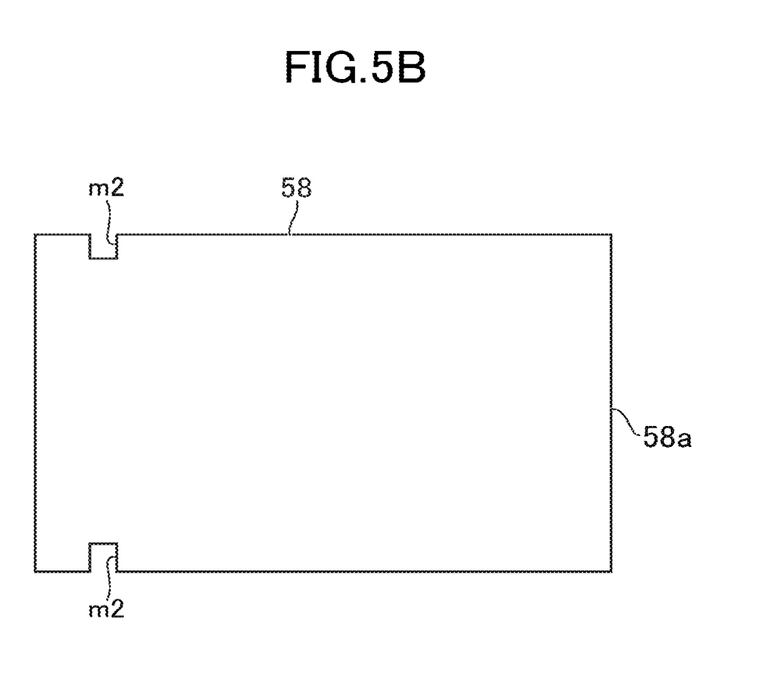
FIG. 5B is a plan view of a processed back reinforcing film.
Figure 6:
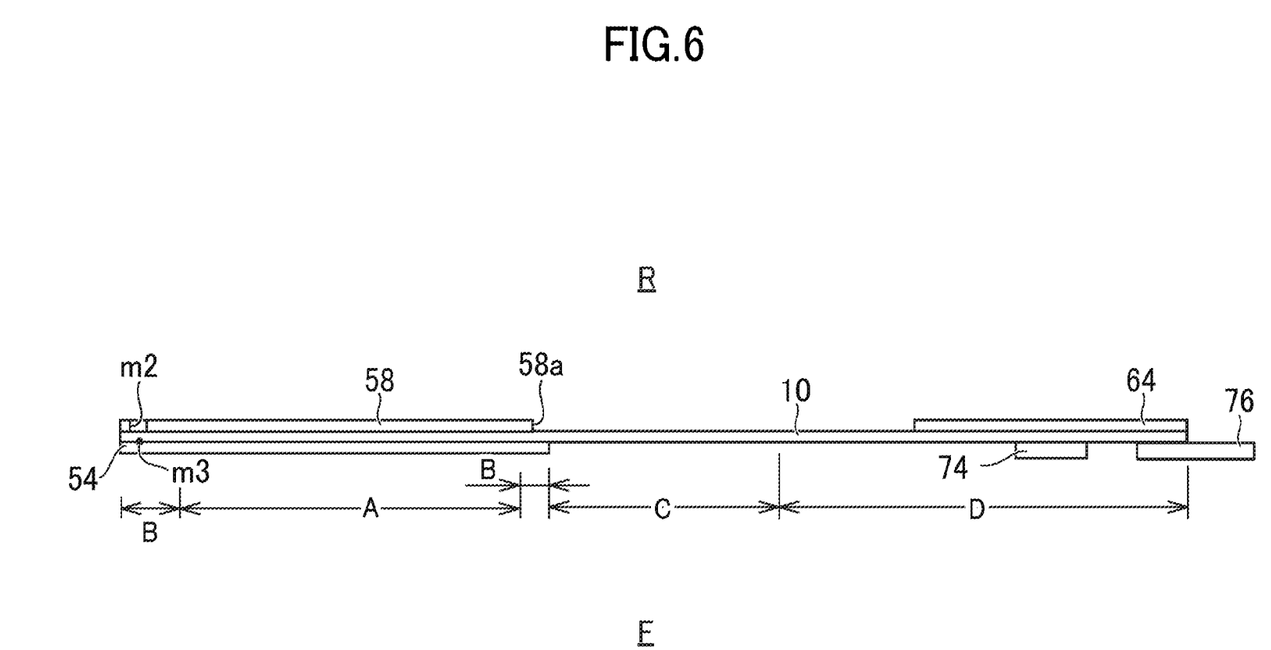
FIG. 6 is a side view of the flexible substrate on which a surface reinforcing film and a back reinforcing film are disposed.
Figure 7:
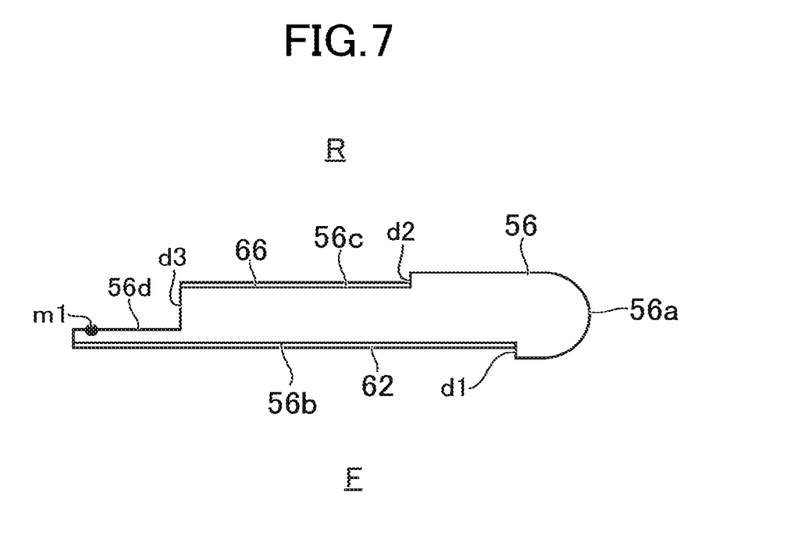
FIG. 7 is a side view of a spacer.
Figure 8:
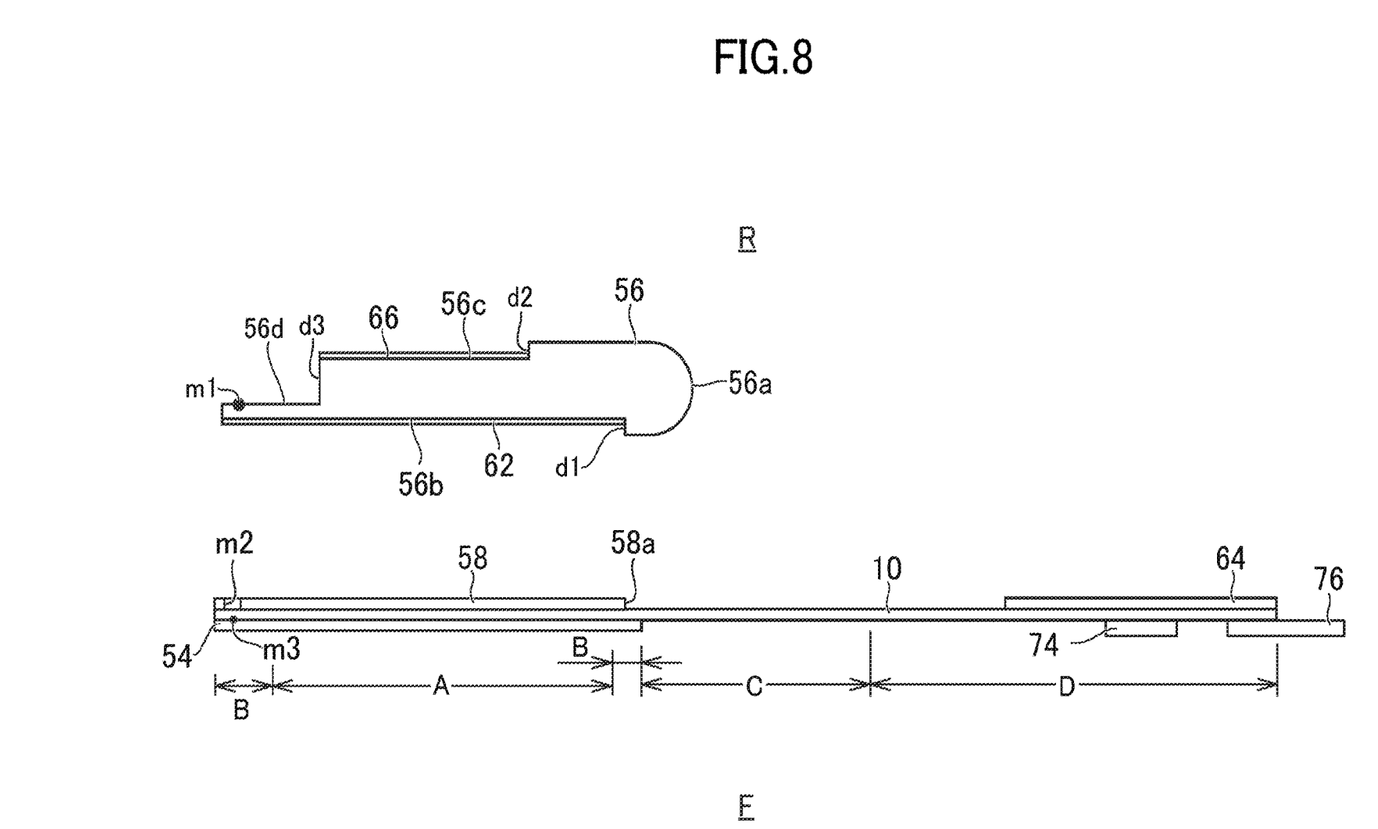
FIG. 8 is a side view of the flexible substrate and the spacer in a state where the spacer is being positioned on the back reinforcing film on the display area.
Figure 9A:
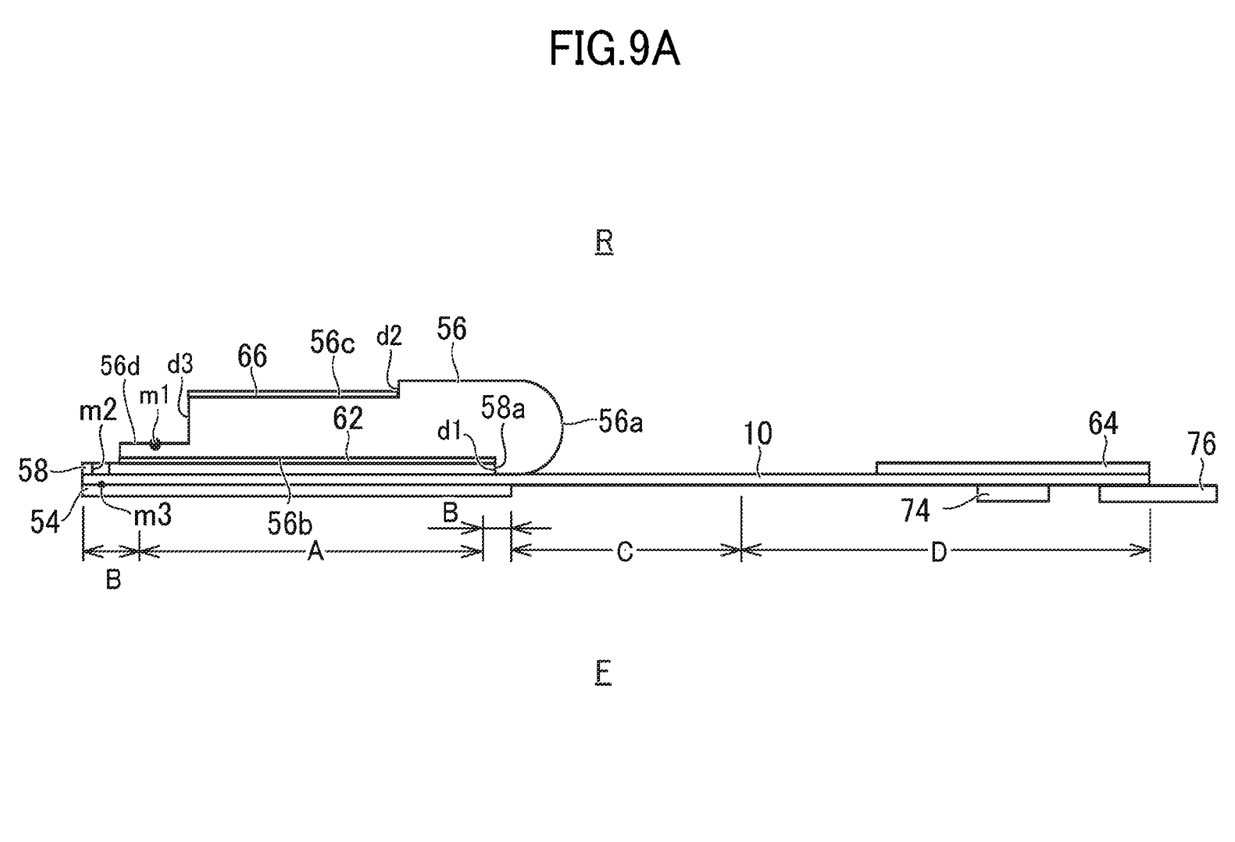
FIG. 9A is a side view of the flexible substrate and the spacer in a state where the spacer is positioned on the back reinforcing film on the display area.
Figure 9B:
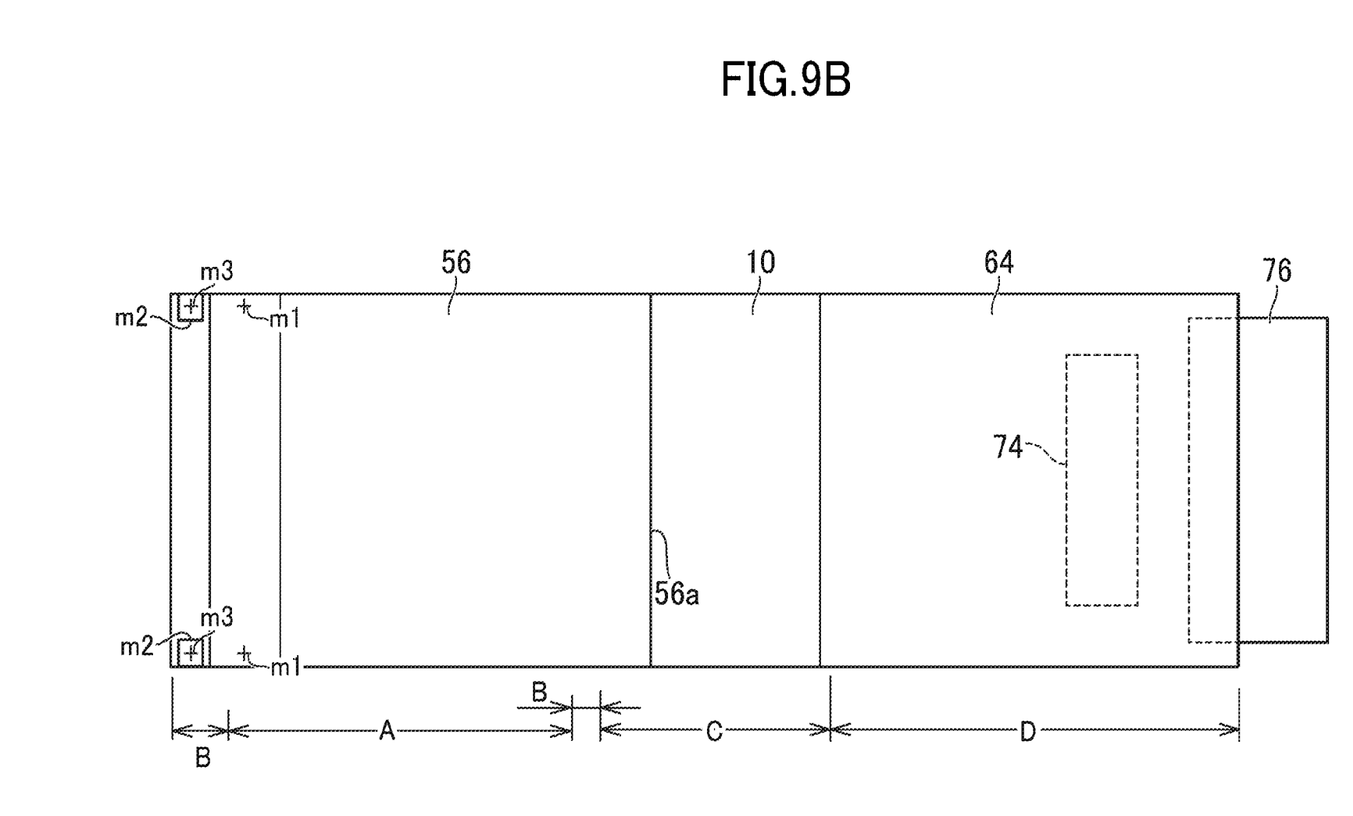
FIG. 9B is a plan view of the flexible substrate and the spacer as viewed from the back in a state where the spacer is positioned on the back reinforcing film on the display area.
Figure 10:
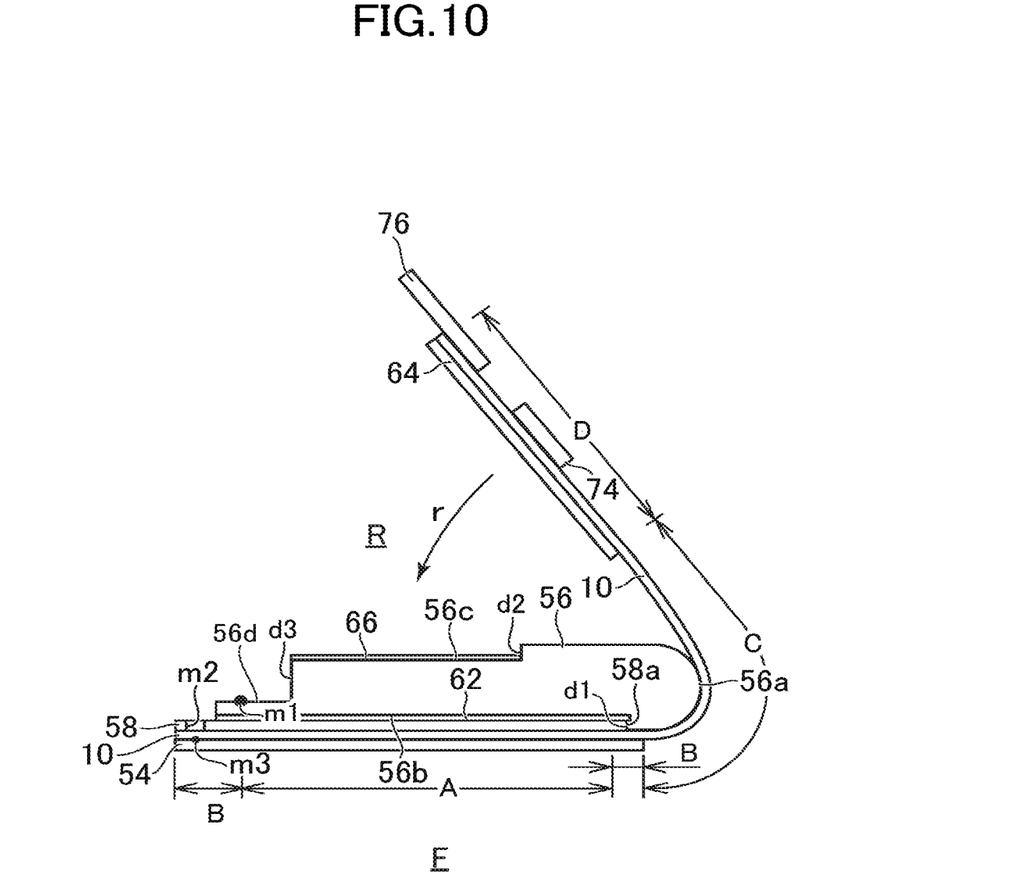
FIG. 10 is a side view of the flexible substrate in a state where the bent area is being bent.

The display device 100 as described above is manufactured by the manufacturing method described below in reference to FIGS. 4 to 10. FIG. 4 is a side view of the flexible substrate in a developed state. FIG. 5A is a plan view of an unprocessed back reinforcing film. FIG. 5B is a plan view of a processed back reinforcing film. FIG. 6 is aside view of the flexible substrate on which the surface reinforcing film and the back reinforcing film are disposed. FIG. 7 is a side view of a spacer. FIG. 8 is a side view of the flexible substrate and the spacer in a state where the spacer is being positioned on the back reinforcing film on the display area. FIG. 9A is a side view of the flexible substrate and the spacer in a state where the spacer is positioned on the back reinforcing film on the display area. FIG. 9B is a plan view of the flexible substrate and the spacer as viewed from the back in a state where the spacer is positioned on the back reinforcing film on the display area. FIG. 10 is a side view of the flexible substrate in a state where the bent area is being bent.

The flexible substrate 10 which is in a developed state (in an unbent state) is prepared. The third alignment mark m3 is provided on the display surface side F of the flexible substrate 10 in the frame area B. Further, the integrated circuit chip 74 and the FPC substrate 76 are disposed on the terminal area D of the flexible substrate 10. FIG. 4 shows the flexible substrate 10 that is prepared by the steps as described above.

Next, as shown in FIG. 5A, an unprocessed back reinforcing film 58 is prepared. The notches m2 are then formed by cutting off portions indicated by the dashed lines C2, and a portion indicated by the dashed line C1 is cut off so as to conform to a size corresponding to the first bottom surface 56b. The notches m2 and a terminal area 58a are formed in a one-time cut-off action using a cutting device. As such, accuracy of the positional relationship (distance) between the notches m2 and the terminal area 58a is maintained. FIG. 5B shows the back reinforcing film 58 that is processed by the steps as described above.

Next, the surface reinforcing film 54 is disposed on the display surface side F of the flexible substrate 10 in a developed state in the display area A and the frame area B, the back reinforcing film 58 is disposed on the back surface side R in the display area A, and the back reinforcing film 64 is disposed on the back surface side R in the terminal area D. The back reinforcing film 58 is disposed such that the notch m2 overlaps the third alignment mark m3. The back reinforcing film 58 is disposed as described, and thus, viewed from the back surface side R of the flexible substrate 10, the third alignment mark m3 is readable through the notch m2 and the transparent flexible substrate 10.

The third alignment mark m3 may be any mark that can be visually checked by a human or detected by an optical imaging device, such as a camera. For example, the third alignment mark m3 may be formed in any shape, such as "+", "□", "Δ", and "o". The same applies to the first alignment mark m1.

Further, the spacer 56 on which the first step d1, the second step d2, and the third step 3d are formed is prepared. The adhesive member 62 is provided on the first bottom surface 56b of the spacer 56, which is more recessed than other areas because of the first step d1 being formed, and the adhesive member 66 is provided on the second bottom surface 56c, which is more recessed that other areas because of the second step d2 being formed. Further, the first alignment mark m1 is provided on the third bottom surface 56d, which is more recessed than the second bottom surface 56c because of the third step d3 being formed. FIG. 7 shows the spacer 56 that is prepared by the steps as described above.

Subsequently, the spacer 56 is positioned on the back reinforcing film 58. In the present embodiment, the spacer 56 is held and moved by a robot, for example, and an optical imaging device, such as a camera, detects the first alignment mark m1 and the third alignment mark m3. In the present embodiment, the first alignment mark m1 is provided on the bottom surface 56d, which is the most recessed bottom surface of the spacer 56, and thus the distance between the first alignment mark m1 and the third alignment mark m3 is short. As such, the first alignment mark m1 and the third alignment mark m3 are easily in focus, and their positional relationship can be accurately detected.

As shown in FIG. 8, while the spacer 56 is moved along the flexible substrate 10 placed on a worktable, for example, the spacer 56 is positioned on the back reinforcing film 58. Specifically, viewed from the back surface side R, the spacer 56 is moved to a position where the first alignment mark m1 is adjacent to the third alignment mark m3 in the longitudinal direction (horizontal direction in FIG. 8) of the flexible substrate 10. The spacer 56 is disposed on the flexible substrate 10 on that position. At this time, the back reinforcing film 58 and the spacer 56 on the flexible substrate 10 are affixed to each other by the adhesive member 62. FIG. 9A shows a side view of the spacer 56 positioned on the back reinforcing film 58, and FIG. 9B shows a plan view of the spacer 56 positioned on the back reinforcing film 58 viewed from the back surface side R.

Here, the example is described in which the position of the third alignment mark m3 on the flexible substrate 10 is detected, although the position of the notch m2 itself on the back reinforcing film 58 may be detected. In other words, for example, a camera may detect the position of the first alignment mark m1 of the spacer 56 and the position of the notch m2 of the back reinforcing film 58, and the spacer 56 may be positioned on the back reinforcing film 58 based on the detected positional relationship.

As shown in FIG. 10, the bent area C of the flexible substrate 10 is bent in the direction of an arrow r. At this time, the bent area C is bent so that the guide section 56a of the spacer 56 is in contact with the bent area C and the bent area C is provided along the guide section 56a. The terminal area D is placed closer to the back surface side R than the spacer 56. At this time, the back reinforcing film 64 is affixed to the adhesive member 66 on the spacer 56, and thus the flexible substrate 10 is maintained to be bent. In accordance with the steps described above, the display device 100 appears in a state as shown in FIG. 1.

The manufacturing method described above can prevent the back reinforcing film 58 from interfering with the first step d1 when the spacer 56 is disposed on the flexible substrate 10. In other words, the manufacturing method can prevent the terminal area 58a of the back reinforcing film 58 extending over the first step d1 of the spacer 56. This is enabled because the accuracy of the positional relationship (distance) between the notch m2 of the back reinforcing film 58 and the terminal area 58a is maintained and the spacer 56 is positioned on the back reinforcing film 58 based on the position of the third alignment mark m3, which can be detected through the position of the first alignment mark m1 of the spacer 56 and the notch m2 of the back reinforcing film 58.

In the present embodiment, the example is explained in which the spacer 56 is held and moved by a robot, for example, but not limited to this. For example, a person as an operator may hold and move the spacer 56 using a tool, such as tweezers. Further, in the present embodiment, an optical imaging device, such as a camera, detects the positions of the first alignment mark m1 and the third alignment mark m3, but not limited to this example. For example, a person as an operator may visually check the first alignment mark m1 and the third alignment mark m3 in order to position the spacer 56 on the back reinforcing film 58.

In the present embodiment, the first alignment mark m1 and the third alignment mark m3 are disposed so as to be adjacent to each other in the longitudinal direction of the flexible substrate 10, and thus the spacer 56 is positioned on the back reinforcing film 58, but not limited to this example. For example, if the spacer 56 can be positioned on the back reinforcing film 58 while viewing and confirming the relative positions of the alignment mark m1 and the alignment mark m3, the first alignment mark m1 and the third alignment mark m3 may not be aligned in the longitudinal direction of the flexible substrate 10. In other words, the position of the first alignment mark m1 may be determined based on the third alignment mark m3.

In the present embodiment, the notch m2 is provided on the back reinforcing film 58 as a second alignment mark, but not limited to this example. The penetration from the back surface side R to the display surface side F may be provided in order to check the third alignment mark m3 on the flexible substrate 10 from the back surface side R. For example, a hole may be provided in place of a notch m2. In this case, in the steps for processing the back reinforcing film 58, forming the terminal area 58a by cutting the back reinforcing film 58 so as to correspond to the size of the first bottom surface 56b and forming a hole in the back reinforcing film 58 may be performed in one step by using the cutting device. This enables to accurately determine the positional relationship between the hole and the terminal area 58a of the back reinforcing film 58.

In the present embodiment, a cross mark is provided on the flexible substrate 10 as the third alignment mark m3, although a cross mark may be provided on a surface of the back surface side R of the back reinforcing film 58 as the second alignment mark. That is, the second alignment mark may not be a notch, for example, but may be configured in the same manner as the first alignment mark m1 and the third alignment mark m3. In this case, in the steps of processing the back reinforcing film 58, a device capable of performing cutting off the back reinforcing film 58 and putting a cross mark in one step may be used. In this case, the third alignment mark m3 needs not be provided on the flexible substrate 10. The spacer 56 may be positioned on the back reinforcing film 58 based on the positional relationship between the second alignment mark m2 on the back reinforcing film 58 and the first alignment mark m1 on the spacer 56.

Figure 12:
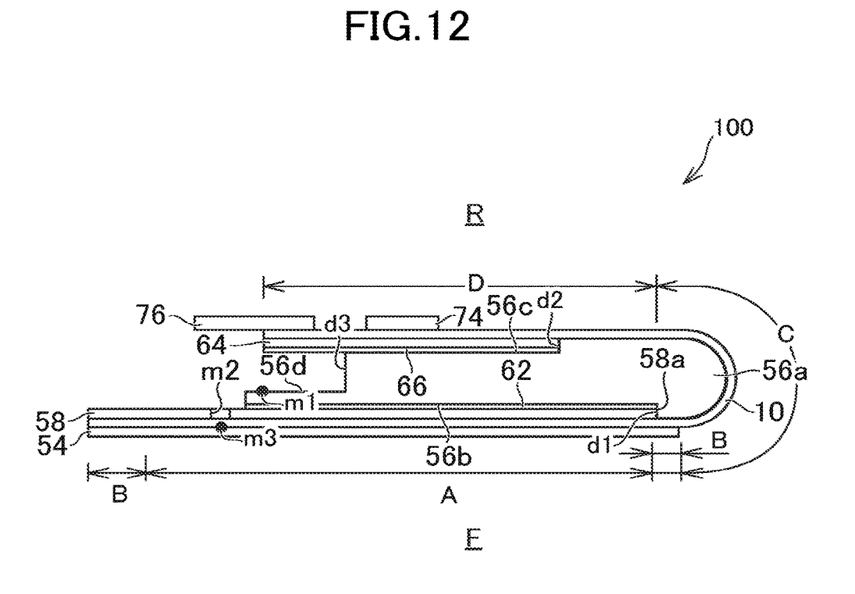
FIG. 12 is a side view of the display device illustrating schematic overall configuration of the display device of a variation.

Further, referring to FIG. 12, a variation of the display device in the present embodiment will be described. FIG. 12 is a side view of the display device illustrating schematic overall configuration of the display device of the variation. As shown in FIG. 12, in the variation, the length of the flexible substrate 10 is relatively longer with respect to the length of the spacer 56 than the length of the flexible substrate 10 shown in FIG. 1. The third alignment mark m3 on the flexible substrate 10 is not provided in the frame area B but in the display area A. Similarly, the notch m2 on the back reinforcing film 58 is not formed on the frame area B of the flexible substrate 10, but formed at the position corresponding to the display area A. Such a configuration may provide the same advantage as the configuration described in the embodiment.

In the present embodiment and the variation, the back reinforcing film 58 and the back reinforcing film 64 are completely separated, but not limited to this example. The back reinforcing film 58 and the back reinforcing film 64 may be partially connected to each other, and the connected part may be bent along the bent area C of the flexible substrate 10. The back reinforcing film 58 corresponds to the first reinforcing film in the present invention, and the back reinforcing film 64 corresponds to the second reinforcing film in the present invention.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
a spacer that includes a first bottom surface on a display surface side and a first alignment mark on a back surface side, the first bottom surface being more recessed than other areas because of a first step being formed on the first bottom surface;
a flexible substrate having flexibility that includes a display area displaying an image, a frame area on a perimeter of the display area, a bent area that is outside the frame area and bent so as to conform to a shape of the spacer, and a terminal area that is disposed on a back surface side of the spacer through the bent area and includes a terminal; and
a first reinforcing film that is disposed on the first bottom surface, which is a back surface side of the display area, and includes a second alignment mark at a position adjacent to the first alignment mark,
wherein the first alignment mark, the spacer, the second alignment mark, and the flexible substrate are arranged in this order in a thickness direction.

2. The display device according to claim 1, wherein the second alignment mark is formed at a position that overlaps the frame area.

3. The display device according to claim 2, wherein a second bottom surface is provided on the back surface side of the spacer, the second bottom surface being more recessed than other areas because of a second step being formed on the second bottom surface, and
a second reinforcing film is disposed on a display surface side of the terminal area, the second reinforcing film being disposed on the second bottom surface.

4. The display device according to claim 3, wherein a third bottom surface is provided on the back surface side of the spacer, the third bottom surface being more recessed than the second bottom surface because of a third step being formed on the third bottom surface, and
the first alignment mark is formed on the third bottom surface.

5. The display device according to claim 3, wherein the second alignment mark is a notch or a hole penetrating from a back surface side of the flexible substrate to a display surface side of the flexible substrate.

6. The display device according to claim 5, wherein a third alignment mark is formed at a position that overlaps the notch or the hole on the flexible substrate.

* * * * *